United States Patent
DePuy (12)

(10) Patent No.: US 6,198,268 B1
(45) Date of Patent: *Mar. 6, 2001

(54) DUAL-RATED CURRENT TRANSFORMER CIRCUIT HAVING AT LEAST TWO INPUT CIRCUITS

(75) Inventor: Robert P. DePuy, Cherry Hill, NJ (US)

(73) Assignee: General Electric Company, Schenectady, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/343,456

(22) Filed: Jun. 30, 1999

(51) Int. Cl.⁷ .................................................. H01F 38/28
(52) U.S. Cl. ............................................................ 323/358
(58) Field of Search ..................................... 323/358, 367, 323/357

(56) References Cited

U.S. PATENT DOCUMENTS 4,140,961 * 2/1979 Akamatsu ............................. 323/358
4,301,491 11/1981 Gryctko .
5,015,983 5/1991 Derosier et al. .

* cited by examiner

Primary Examiner—Shawn Riley
(74) Attorney, Agent, or Firm—Robert M. Schulman; Carl B. Horton; Hunton & Williams

(57) ABSTRACT

A dual-rated current transformer circuit has a first circuit which delivers a first current and a second circuit which delivers a second current. A current transformer is coupled to both the first and second circuits, wherein the transformer generates a current proportional to the current of each of the first and second currents.

11 Claims, 4 Drawing Sheets

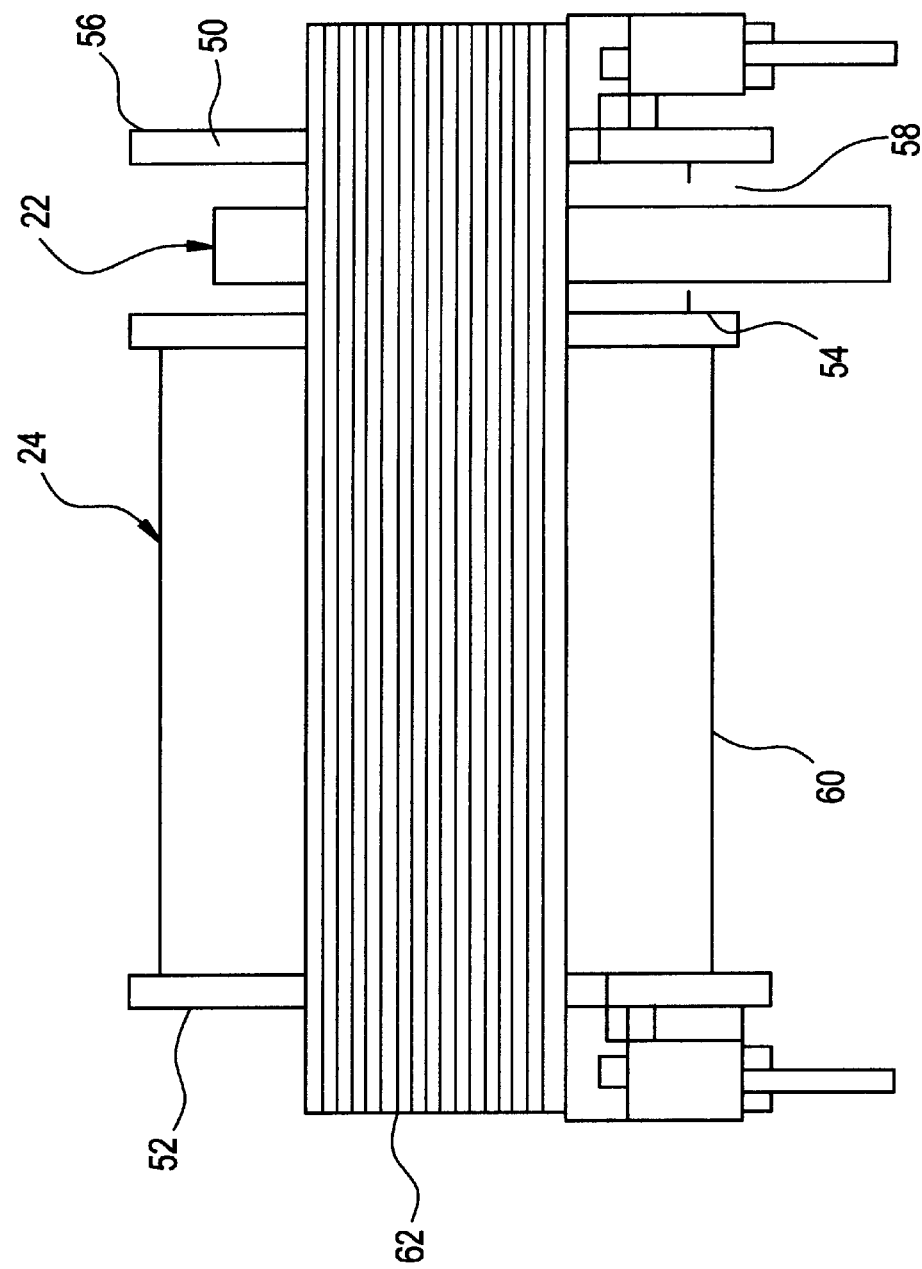

DUAL-RATED CURRENT TRANSFORMER CIRCUIT HAVING AT LEAST TWO INPUT CIRCUITS

BACKGROUND OF THE INVENTION

1. Field of the Invention

The present invention relates to a dual-rated current transformer circuit, and more particularly to a miniature dual-rated transformer circuit for use in a protective relay.

2. Discussion of the Prior Art

The use of protective relays for or in a circuit breaker or other electrical apparatus is well known. Traditionally, the relay detects a condition and generates a signal to operate, for example, a trip coil in a low ampere industrial rated circuit breaker. A current transformer assembly is utilized to provide operating power to the trip coil. Traditionally, a single current transformer core fits within the circuit breaker and supplies a sufficient current and operating power to the trip unit circuit for a number of ampere ratings.

One manner of decreasing size constraints but still allowing a circuit to operate over a wide range of ampere ratings is to utilize a fixed transformer size and a fixed secondary winding thereon. The number of primary turns are varied inversely with the circuit ampere rating. See U.S. Pat. No. 5,015,983, assigned to the assignee of the present invention. However, varying the number of primary turns in a current transformer circuit will not allow different input current ratings to produce the same current through the primary winding.

Moreover, larger breakers for industrial or utility applications traditionally utilize protective relays that have their own enclosures. The protective relays have a source of power to operate other than from the current transformer. The output of the protective relay is normally a contact or solid-state device to connect the trip coil to a source of power independent from the relay. For this application, the current transformers are used to replicate and isolate the input current and are normally rated one ampere or five amperes. The current transformer must work over a large current range that includes fault current, which is much greater than rated current for protection and metering, and metering current which can be less than rated current. Traditionally, a typical current transformer for a one ampere input rating would have a twenty turn primary and a separate design for a five ampere input rating which would have four turns.

SUMMARY OF THE INVENTION

It would be economically desirable, therefore, to provide a dual-rated current transformer circuit which allows for at least two different current input ratings to be delivered to the transformer. Moreover, it is desirable to utilize a circuit which can be miniaturized.

One aspect of the present invention is to provide a dual-rated current transformer circuit which utilizes a transformer having a reduced size.

Another aspect of the invention is a transformer circuit which will meet the application requirements using a typical magnetic material that has a relatively low cost. The number of turns can vary due to changes in the magnetic material or application.

Still another aspect of the invention is a transformer circuit which is designed to produce the same output current with a first rated current or a second rated current.

According to presently preferred embodiments of the present invention, a dual-rated current transformer circuit has a first current line which delivers a first current and a second current line which delivers a second current. A transformer is coupled to both the first and second current lines, wherein the transformer generates a current proportional to the current of each of the first and second current lines. The transformer of the circuit incorporates design features which reduce its overall size.

BRIEF DESCRIPTION OF THE DRAWINGS

Other features and advantages of the present invention will become apparent from the following description of preferred embodiments of the invention which refers to the accompanying drawings, wherein:

FIG. 4 is a side view of a transformer used in the circuit of the present invention.

DETAILED DESCRIPTION OF THE INVENTION

The dual-rated transformer circuit, and the miniature size of the transformer incorporated therein allows for a protective relay having a reduced size. It should be appreciated that the circuit of the present invention is not limited to use in protective relays, but can be used in a plurality of different applications.

Figure 1:
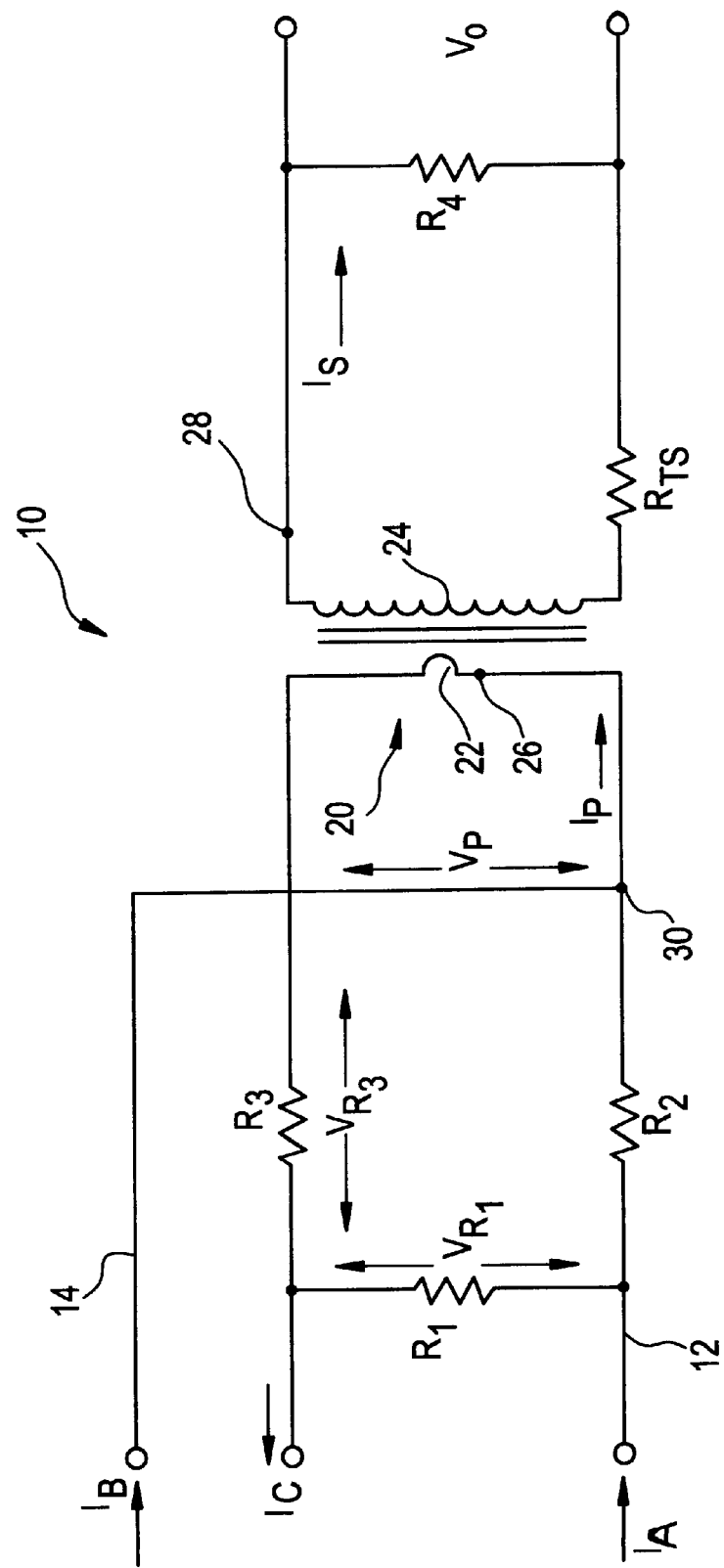
FIG. 1 is a schematic diagram of a first embodiment of the dual-rated current transformer circuit of the present invention.

A dual-rated current transformer circuit 10 is illustrated in FIG. 1. Circuit 10 includes resistors $R_1$, $R_2$ and $R_3$ connected in series. A first current $I_A$ or a second, different current $I_B$ is fed via current lines 12 and 14. A common current $I_C$ represents a common return path for both $I_A$ and $I_B$.

A current transformer 20 communicates with both currents $I_A$ and $I_B$. Transformer 20 is a dual-rated transformer as both of the different currents rates $I_A$ or $I_B$ will produce the same current within the primary coil of the transformer, which will be described further herein. Thus, transformer 20 generates a current $I_P$ proportional to either current $I_A$ or $I_B$.

Transformer 20 includes a primary coil 22 and a secondary coil 24. For example, transformer 20 can be a ferromagnetic core transformer. Primary coil 22 is single turn while the secondary coil 24 has multiple turns, for example, 13,000 turns. The stepped-down current $I_S$ of secondary coil 24 is proportional to the current $I_P$ through primary coil 22, said current $I_P$ being the same for both current rates $I_A$ or $I_B$. The circuit of the present invention is designed for both $I_A$ or $I_B$ such that a standard transformer could be used for the most common relay input currents.

Secondary coil 24 is designed to provide a low reflected resistance to primary 22 and a low burden to the transformer. Secondary coil 24 includes resistance $R_{TS}$. A fourth resistor $R_4$, together with $R_{TS}$, reflects to the primary. The polarity of primary coil 22 is noted at 26 and the polarity of secondary coil 24 at 28. An output burden which is low minimizes the transformer size. Ultimately, the output burden should be lower than the transformer secondary resistance $R_{TS}$.

The resistor network $R_1$, $R_2$ and $R_3$ provides for two different current inputs $I_A$ or $I_B$ to supply a current to transformer primary 22 at a value lower than $I_B$. Referring again to FIG. 1, working from node 30, current $I_B$ is delivered along line 14 to node 30, and because of the shunt arrangement of the circuit, results in the current $I_P$ through the transformer primary. Current $I_A$ travels to node 30 via line 12 and also produces the same current $I_P$. The voltage across $R_1$, for current $I_A$, can be derived from the following equation:

$$V_{R1} = \frac{I_A R_1 (R_2 + R_3)}{R_1 + R_2 + R_3}$$

Thus, the current $I_P$ can be derived from current $I_A$ by the equation 2:

$$I_P = V_{R1}/R_2 + R_3 = I_A R_1/R_1 + R_2 + R_3 \quad (2)$$

Likewise, $V_{R3}$ and $I_P$ can be determined by using the current $I_B$ and the voltage $V_{R3}$ across resistor $R_3$ by the following equations:

$$V_{R3} = I_B(R_1 + R_2)R_3/R_1 + R_2 + R_3$$

$$I_P = V_{R3}/R_3 = I_B(R_1 + R_2)/R_1 + R_2 + R_3 \quad (3)$$

Equating equations (2) and (3):

$$I_A = I_B(R_1 + R_2)/R_1$$
$$I_A/I_B = (R_1 + R_2)/R_1$$
$$= 1 + R_2/R_1$$
$$(4) R_2/R_1 = I_A/I_B - 1$$

An example of a dual-rated current transformer circuit according to the present invention is as follows:
Assume
$I_A$=5 amperes
$I_B$=1 ampere
$I_P$=0.45 amperes
$R_{TS}$=4000 Ω
$R_4$=2000 Ω
$V_O$=0.0692 volts, at rated input current
$N_P$=1
Wherein $N_P$ is the number of turns of the transformer primary and $N_S$ is the number of turns of the transformer secondary. Because the number of ampere turns of the primary must equal the number of ampere turns in the secondary, the number of turns in the secondary coil can be determined as follows:

$$N_S = N_P I_P / I_S \quad (5)$$

From Ohm's Law:
$V_O = I_S R_4$ where $V_O$ is the voltage across $R_4$.
Thus,
$V_O = I_P N_P R_4 / N_S$
$N_S = N_P I_P / I_S = N_P I_P R_4 / V_O$
$N_S = 1 \cdot 0.45 \cdot 2000/0.0692$
$N_S = 13006$ turns
From equation (5):
$N_S I_S = N_P I_P$
$I_S/I_P = N_P/N_S$
$V_S = (R_{TS} + R_4)I_S$, where $V_S$ is the voltage across secondary 24.
Thus $V_P$, the voltage across primary 22, is:

$$V_P = V_S \times N_P / N_S$$

Letting $R_P$ be the value of the secondary resistance reflected to the primary:

$$R_P I_P = (R_{TS} + R_4) I_S N_P / N_S$$
$$R_P = (R_{TS} + R_4) \cdot I_S / N_S \cdot N_P / I_P$$
$$R_P = (R_{TS} + R_4) \cdot N_P / I_P \cdot N_P / I_P$$
$$R_P = (N_P/N_S)^2 (R_{TS} + R_4)$$
$$= (1/13006)^2 (4000 + 2000)$$
$$R_P = 35.5 \times 10^{-6} \text{ ohms}$$

Because any voltage that is reflected to the primary will circulate a current, $R_1 + R_2 + R_3$ must be very high compared to $35.5 \times 10^{-6}$ ohms. Therefore assume that:

$$R_1 + R_2 + R_3 = 3.55 \times 10^{-6} \text{ ohms}$$

Then from equation (2):

$$R_1 = I_P(R_1 + R_2 + R_3)/I_A$$
$$= 0.45 \times 3.55 \times 10^{-3}/5$$
$$R_1 = 320 \times 10^{-6} \text{ ohms}$$

From equation (4):

$$R_2 = (I_A/I_B - 1)R_1$$
$$= 320 \times 10^{-6}(5/1 - 1)$$
$$R_2 = 1.28 \times 10^{-3} \text{ ohms}$$

From equation (2):

$$I_P = I_A R_1/R_1 + R_2 + R_3$$
$$R_3 = (I_A R_1/I_P) - (R_1 + R_2)$$
$$= (5(320 \times 10^{-6})/0.45) - (320 \times 10^{-6} + 1.28 \times 10^{-3})$$
$$R_3 = 1.96 \times 10^{-3} \text{ ohms}$$

Since $I_A$ or $I_B$ are current sources which come from a current transformer of the power system which typically has a source impedance greater than 100 Ω, they typically would have an impedance more than two orders of magnitude higher than the sum of $R_1 + R_2 + R_3$.
Then the voltage across the primary can be calculated from the equation:

$$V_P = I_P(R_{TS} + R_4)/N_S^2$$
$$= (0.45 \times 6000) \times (13,006 \times 13,006)$$
$$V_P = 15.96 \times 10^{-6} v$$

Letting the circulating current of $R_1 + R_2 + R_3$ be Inca which will subtract from $I_P$.

$$I_{PC} = V_P/R_1 + R_2 + R_3$$
$$= 15.96 \times 10^{-6}/3.55 \times 10^{-3}$$
$$I_{PC} = 4.50 \times 10^{-3} A$$

Thus, $I_{PC}$ is approximately 1% of $I_P$ and can be corrected by lowering the secondary turns.

Figure 2:
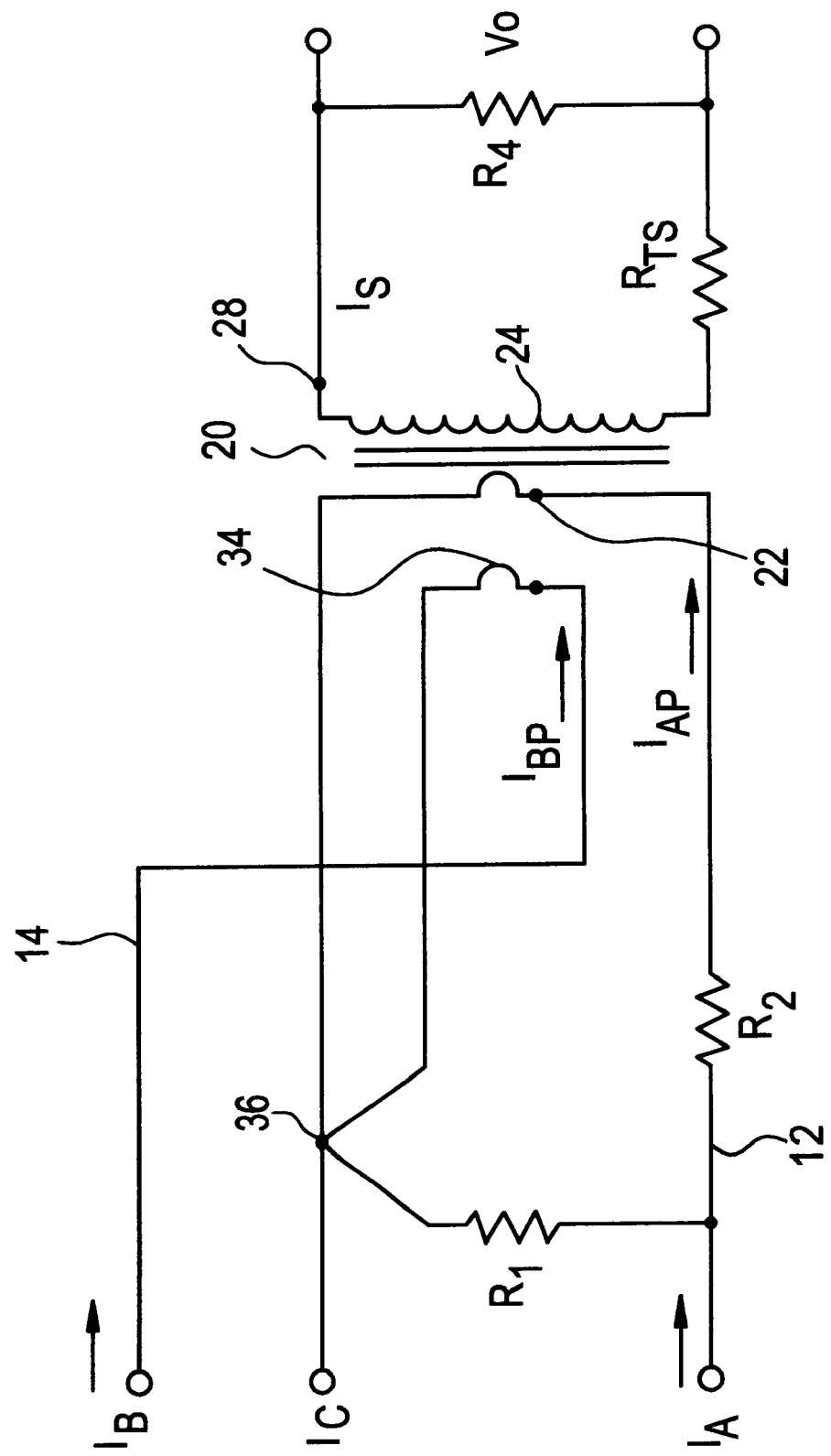
FIG. 2 is a schematic diagram of a second embodiment of the dual-rated current transformer circuit.

An alternative embodiment of the circuit of FIG. 1 is shown in FIG. 2. As shown in FIG. 2, transformer 20 includes a first primary coil 22 through which current $I_{AP}$ flows and a second primary coil 34 through which current $I_{BP}$ flows. If $R_3$ (FIG. 1) becomes zero, $I_B$ will equal the current through the primary $I_P$, see equation (3). Because the connection from $I_B$ to $I_C$ will have some resistance, the current should flow through second primary 34. The end of the second primary for $I_{BP}$ is connected to $I_C$ at the same node 36 as $R_1$ to prevent current flowing through $R_1$ in series with $R_2$. The current $I_B$ which is equal to $I_{BP}$ flows through primary coil 34 and back to $I_C$. The voltage across $R_1$ can be derived from the following equation:

$$V_{R1} = \frac{I_A R_1 R_2}{R_1 + R_2}$$

From Ohm's Law:

$$I_{AP} = V_{R1}/R_2$$

Thus, the current $I_{AP}$ can be derived from current $I_A$ by the equation:

$$I_{AP} = V_{R1}/R_2 = I_A R_1/R_1 + R_2$$

If $I_B$=1A and $I_A$=5A, and since $I_{BP}$=$I_{AP}$=$I_B$, the resistance ratio $R_1/R_1+R_2$ can be calculated as follows:

$$R_1/R_1 + R_2 = I_{AP}/I_A$$
$$= 1/5$$
$$R_1/R_1 + R_2 = 0.2$$

The above is a special case where $I_B$=$I_{BP}$ and where having two, single turn primaries does not effect the relay design.

Figure 3:
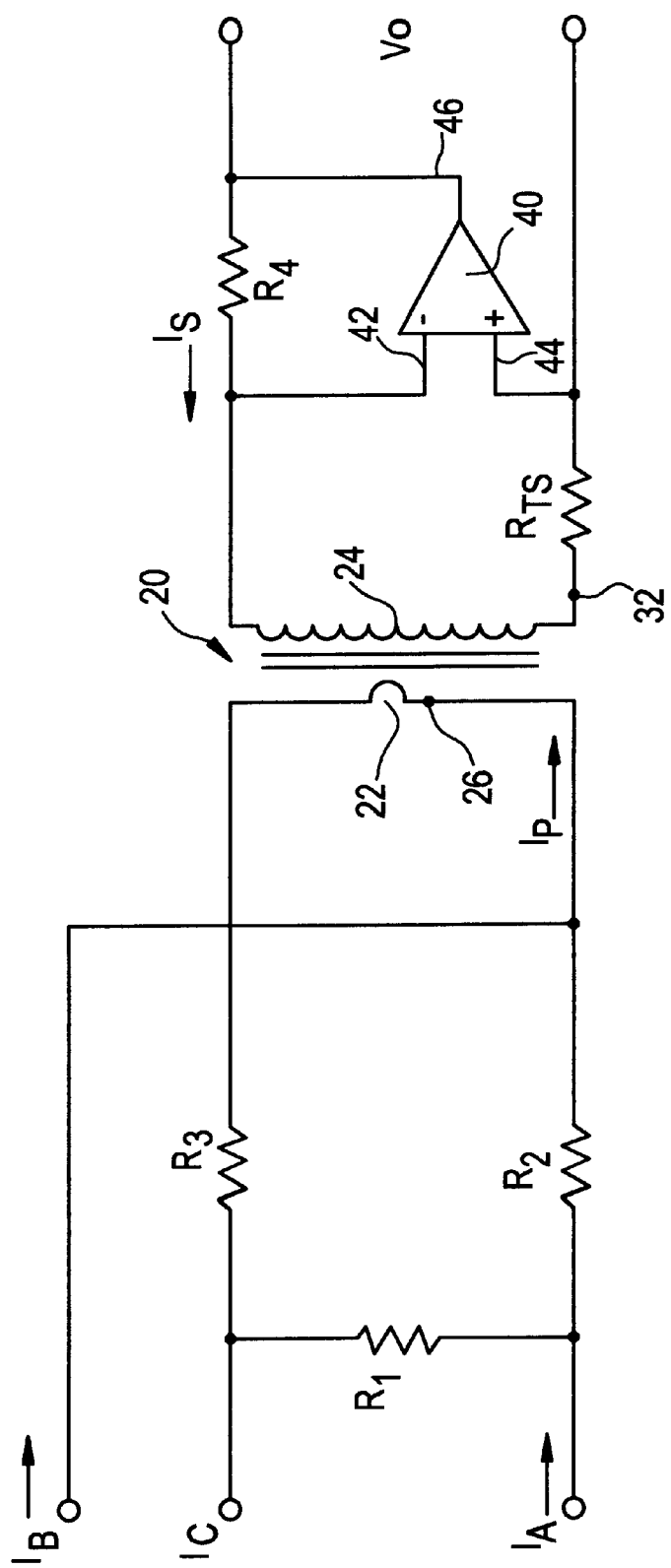
FIG. 3 is a schematic diagram of a third embodiment of the dual-rated current transformer circuit.

Referring to FIG. 3, another embodiment of the invention is shown, wherein the voltage burden of transformer 20 is reduced by approximately the value of $R_4$ by the addition of an inverting amplifier 40. Amplifier 40 includes an inverting input terminal 42 marked (−), noninverting input terminal 44 marked (+) and an output terminal 46. The circuit also includes secondary coil 24 having a polarity shown at 32.

Because the voltage at the input to the inverting amplifier is near zero, $I_S$ flows through $R_4$ and produces an output voltage equal to the $V_O$ of FIG. 1, with the same current flowing. Because the amplifier is inverting the polarity of the secondary must be reversed to keep $V_O$ the same as in FIG. 1.

The transformer output does not see the burden of $R_4$ which would allow for a higher input current rating. Because the burden is reduced, the transformer size can be reduced with the same input current rating.

Referring to FIG. 4, the transformer 20 incorporated in the circuit will be described further. The transformer includes a bobbin 50 which has three flanges, 52 54 and 56. The bobbin has a first winding area 58 between flanges 54 and 56 and a second winding area 60 substantially larger than area 58 between flanges 52 and 54. The primary coil 22 is wrapped by at least one turn around the bobbin in area 58 and the secondary coil 24 is wrapped around the larger area 60. Thus, the majority of the winding in transformer 20 is the secondary winding which will produce a low resistance. This reduces the flux excursion and current excitation of the magnetic material 62 which is wrapped about the bobbin. Magnetic material 62 is a low excitation material. Using most of the winding area for the secondary winding and using a low excitation material for the magnetics are two design techniques which enable the size of the transformer to be reduced.

In summary, the dual-rated current transformer circuit of the present invention allows for two different current input ratings to be delivered to the transformer. Moreover, the circuit can be miniaturized due to the input circuit which lowers the input current to the transformer and design techniques of the transformer which allow for size reduction.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A dual-rated current transformer circuit comprising:
a transformer having an input line;
a first circuit in communication with said input line, said first circuit adapted to receive a first current; and
a second circuit in communication with said input line, said second circuit adapted to receive a second current that is different from said first current, wherein said first circuit and said second circuit are each adapted to provide a third current to said input line that is the same regardless of whether said first circuit or said second circuit is providing said third current.

2. The circuit of claim 1, wherein said first circuit and said second circuit share a common current return line.

3. The circuit of claim 1, wherein at least one of said first circuit and said second circuit comprise a plurality of resistors.

4. The circuit of claim 1, wherein said transformer provides a stepped down current on an output line.

5. The circuit of claim 1, wherein said transformer has a primary coil and a secondary coil, wherein said secondary coil provides a low reflected impedance to said primary coil.

6. The circuit of claim 1, wherein said transformer comprises magnetic material wrapped about a primary coil and a secondary coil.

7. The circuit of claim 6, wherein said magnetic material is a low excitation type of material.

8. The circuit of claim 1, wherein said transformer has a primary coil and a secondary coil, wherein said secondary coil reflects a low resistance to the primary coil and a low burden to the transformer.

9. The circuit of claim 1, wherein said transformer comprises a plurality of primary coils.

10. The circuit of claim 9, wherein each of said plurality of primary coils comprises a single turn.

11. The circuit of claim 1, further comprising an operational amplified coupled to said transformer.

* * * * *